(12) United States Patent
Obata et al.

(10) Patent No.: US 6,812,412 B2
(45) Date of Patent: Nov. 2, 2004

(54) MULTI-LAYER WIRING BOARD AND METHOD OF PRODUCING SAME

(75) Inventors: Souichi Obata, Kawasaki (JP); Kazuhiko Iijima, Kawasaki (JP); Yasutomo Maehara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/107,446

(22) Filed: Mar. 28, 2002

(65) Prior Publication Data

US 2003/0098179 A1 May 29, 2003

(30) Foreign Application Priority Data

Nov. 29, 2001 (JP) .......................................... 2001-364687

(51) Int. Cl.⁷ .............................. H05K 1/11; H01R 12/04
(52) U.S. Cl. ...................... 174/261; 174/256; 174/261; 174/264; 361/792; 361/807
(58) Field of Search ......................... 174/262, 255, 174/256, 258, 261, 263, 264; 361/792, 748, 746, 795, 803, 813

(56) References Cited

U.S. PATENT DOCUMENTS

| | | | | |
|---|---|---|---|---|
| 5,046,238 A | * | 9/1991 | Daigle et al. ................. | 29/830 |
| 5,309,629 A | * | 5/1994 | Traskos et al. ............... | 29/830 |
| 5,340,947 A | * | 8/1994 | Credle et al. ................ | 174/262 |
| 5,517,751 A | * | 5/1996 | Bross et al. .................. | 29/830 |
| 5,576,519 A | * | 11/1996 | Swamy ........................ | 174/265 |
| 5,939,789 A | | 8/1999 | Kawai et al. | |
| 5,977,490 A | * | 11/1999 | Kawakita et al. ........... | 174/265 |
| 6,013,876 A | * | 1/2000 | Caporizzo ................... | 174/262 |
| 6,139,777 A | * | 10/2000 | Omoya et al. .............. | 252/500 |
| 6,143,116 A | * | 11/2000 | Hayashi et al. ............. | 156/233 |
| 6,373,000 B2 | * | 4/2002 | Nakamura et al. ......... | 174/264 |
| 6,465,084 B1 | * | 10/2002 | Curcio et al. ............... | 428/209 |
| 6,504,111 B2 | * | 1/2003 | Curcio et al. ............... | 174/264 |
| 6,518,514 B2 | * | 2/2003 | Suzuki et al. ............... | 174/262 |

FOREIGN PATENT DOCUMENTS

| | | |
|---|---|---|
| JP | 7-240582 | 9/1995 |
| JP | 2000-13023 | 1/2000 |
| JP | 2000-269647 | 9/2000 |
| JP | 2001-15913 | 1/2001 |
| JP | 2001-160686 | 6/2001 |

* cited by examiner

Primary Examiner—Kamand Cuneo
Assistant Examiner—I B Patel
(74) Attorney, Agent, or Firm—Armstrong, Kratz, Quintos, Hanson & Brooks, LLP

(57) ABSTRACT

A multi-layer wiring board is produced by laminating a plurality of insulating layers having conductor circuits, wherein the conductor circuits of the insulating layers are electrically connected together through via-holes in insulating connection layers having no conductor circuit, and the regions other than the conductor circuits of the insulating layers and the regions other than the via-holes of the connection layers are directly joined together by press-adhering the insulating resins that constitute the respective layers.

15 Claims, 6 Drawing Sheets

MULTI-LAYER WIRING BOARD AND METHOD OF PRODUCING SAME

BACKGROUND OF THE INVENTION

1. Field of the Invention

The present invention concerns a multi-layer wiring board. More specifically, the invention concerns a multi-layer wiring board having a large number of layers capable of being easily produced with a high yield, at a low cost and at one time. The invention further concerns a method of easily producing a multi-layer wiring board having a large number of layers with a high yield, at a low cost and at one time.

2. Description of the Related Art

In recent years, electronic parts have been produced in small sizes and in reduced weights, and an increase of the densities of the printed wiring boards are being accelerated.

As is well known, a printed wiring board of a high density includes a build-up wiring board. The build-up wiring board is conventionally produced by forming a lower-layer circuit on the surface of a copper-lined laminated plate, flattening the surface of the laminated plate with a resin, forming an upper-layer circuit on the flattened surface, and electrically connecting the upper-layer circuit to the lower-layer circuit through a via-hole (filled via) filled with a conductor. By repeating a series of these production steps, further, there can be produced a wiring board of a multi-layer structure, i.e., multi-layer wiring board. According to this build-up production method, however, the circuits are successively laminated on a piece of substrate, i.e., the layers are successively laminated on upon another. Therefore, if there occurs a failure during the production of the multi-layer wiring board (according to the prior art method, failure often occurs in forming the circuit), the whole substrate being produced becomes defective. That is, the final yield becomes a product of the yields of each of the steps. As a result, therefore, the yield drops and the cost of the product increases.

To avoid the problems inherent in the above-mentioned prior art method of successively laminating the layers, a method for laminating a plurality of circuit boards at one time has been developed and put into practical use. This method is called a batch lamination method according to which a circuit board is fabricated by forming circuit(s) and filled via(s) for each of the copper-lined laminated plates, a predetermined number of circuit boards are laminated via an adhesive layer and then the laminated product is heated and press-adhered. According to this batch lamination method, however, it is necessary to provide a low-melting point metal layer on an end surface of the filled via to use the metal layer for junction to the circuit board after the circuit board has been formed, and thus there arises the problems of requiring complex production steps and driving up the cost of production. Further, when the adhesive layer is used, the electric connection between the upper circuit board and the lower circuit board is adversely effected by the flow of the adhesive.

Described below are some examples of the prior art batch lamination method involving the above-mentioned problems. Japanese Unexamined Patent Publication (Kokai) No. 7-240582 discloses a multi-layer wiring board obtained by laminating two or more ceramic insulating films each having a wiring formed on either the front surface or the back surface thereof and a filled via. The individual insulating films are coated with an adhesive, laminated, heated and press-adhered together at one time.

Further, Japanese Unexamined Patent Publication (Kokai) No. 2000-13023discloses a method of producing a multi-layer printed wiring board comprising the steps of:

- impregnating a nonwoven aramide fabric with a thermo-setting resin, forming through-holes therein when it is half-cured, filling the resulting through-holes with an electrically conducting paste to form an adhesive sheet for use as an interlayer insulating sheet;
- forming the inner layer members having an electrically conducting pattern on both surfaces of an insulating substrate that has holes filled with the electrically conducting paste;
- alternately laminating the inner layer members and the adhesive sheets for insulating the interlayers in a plurality of number of pieces; and
- forming through-holes that penetrate through the obtained laminate thereby to form an outer-layer conductor circuit.

Furthermore, Japanese Unexamined Patent Publication (Kokai) No. 2000-269647 discloses a multi-layer printed wiring board produced by successively laminating a plurality of single-sided circuit boards for lamination each comprising an insulating resin base material (e.g., nonwoven base material impregnated with a resin), a conductor circuit formed on one surface thereof and a filled via penetrating therethrough, via an adhesive layer which is applied to a single-sided circuit board for a core, and heat-pressing them together with the once application of pressure.

Further, Japanese Unexamined Patent Publication (Kokai) No. 2001-15913 discloses a multi-layer printed wiring board produced by laminating a plurality of single-sided circuit boards each comprising an insulating base material of a glass epoxy composite material, a conductor circuit formed on one surface thereof and a filled via penetrating therethrough, and heating and pressing them together via an adhesive at one time.

Furthermore, Japanese Unexamined Patent Publication (Kokai) No. 2001-160686 discloses a method of producing a multi-layer printed wiring board by laminating, at one time, a first printed board and a second printed board each having a conductor layer on one surface thereof. Each printed board has a via-hole filled with a conductor. The printed boards are bonded together by using an adhesive.

SUMMARY OF THE INVENTION

It is an object of the present invention to provide a multi-layer wiring board having a large number of layers capable of easily producing at one time, at a high yield and at a low cost.

Another object of the present invention is to provide a multi-layer wiring board in which the upper and lower circuit boards are electrically connected with a high degree of reliability.

A further object of the present invention is to provide a method of producing a multi-layer wiring board having a large number of layers at a high yield and at a low cost with a batch lamination method.

A still further object of the present invention is to provide a method of producing a multi-layer wiring board in which the upper and lower circuit boards are electrically connected with a high degree of reliability.

The above objects and other objects of the present invention will be easily understood from the following detailed description of the present invention.

The present invention, in one aspect thereof, resides in a multi-layer wiring board which comprises a laminated product of a plurality of insulating layers having conductor circuits, wherein the conductor circuits of the insulating layers are electrically connected together through conductor-filled via-holes of an insulating connection layer having no conductor circuit disposed between the insulating layers, connection surfaces of the conductor circuits and connection surfaces of the conductors in the via-holes are joined together by a metal bonding portion formed by diffusing, in the conductor of the conductor circuit of the insulating layers, a junction conductor which may be the same as, or is different from, the conductor filled in said via-holes of the connection layers, and the regions other than the conductor circuits of the insulating layers and the regions other than the via-holes of the connection layers are directly joined together by press-adhering the insulating resins that constitute the respective layers.

The present invention, in another aspect thereof, resides in a method of producing a multi-layer wiring board which comprises a laminated product of a plurality of insulating layers having conductor circuits, comprising the steps of:

electrically connecting the conductor circuits of the insulating layers together through conductor filled via-holes of an insulating connection layer having no conductor circuit disposed between the insulating layers, wherein connection surfaces of the conductor circuits and connection surfaces of the conductors in the via-holes are jointed together by a metal bonding portion formed by diffusing, in the conductor of the conductor circuits of the insulating layers, a junction conductor which may be the same as, or is different from, the conductor filled in the via-holes of the connection layers, and the regions other than the conductor circuits of the insulating layers and the regions other than the via-holes of the connection layers and directed joined together by press-adhering the insulating resins that constitute the respective layers.

DESCRIPTION OF THE PREFERRED EMBODIMENTS

Figure 1:
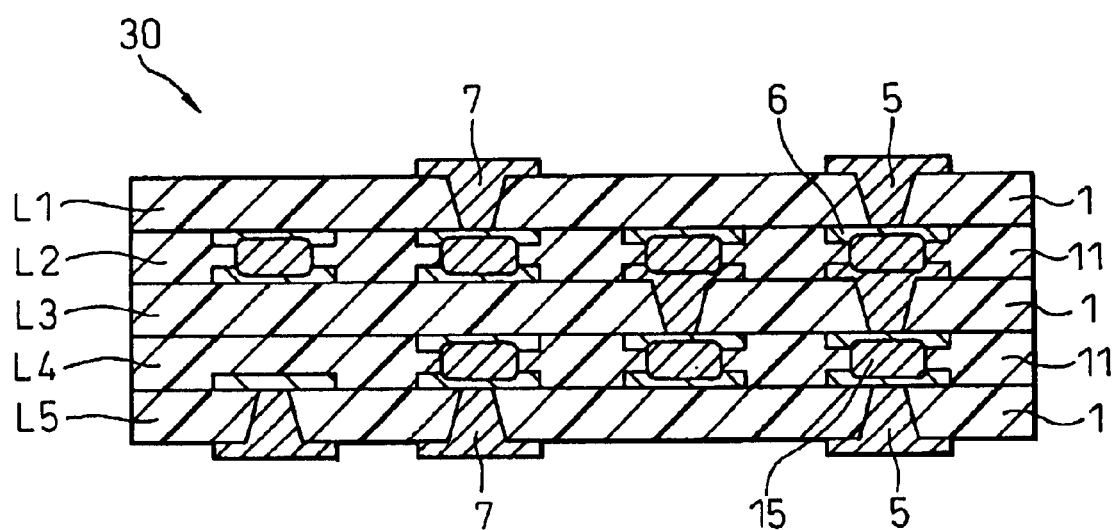
FIG. 1 is a sectional view illustrating a preferred example of a multi-layer wiring board of the present invention.

The present invention resides in a multi-layer wiring board obtained by laminating a plurality of insulating layers each having one or more conductor circuits. The multi-layer wiring board of the present invention, therefore, has a basic constitution similar to that of the conventional multi-layer wiring boards with the exception of characteristic differences that will be described below in detail. Namely, the multi-layer wiring board comprises a laminate of a plurality of insulating layers each having, basically, at least one conductor circuit such as wiring, electrodes, etc. on one or both surfaces thereof. Generally, the conductor circuit is included as an outer layer and, if necessary, as an inner layer, too. It should be noted that, in the conventional multi-layer wiring boards, the conductor circuits have been connected to each other by utilizing metal-plated through-holes, while the multi-layer wiring board of the present invention does not use such through-holes to avoid any inconvenience due to presence of the through-holes.

First, in the multi-layer wiring board of the present invention, when the multi-layer wiring board is produced by laminating a plurality of insulating layers (also referred to as "circuit boards" in this application) having a conductor circuit, at one time, there is sandwiched between the upper and lower circuit boards an insulating sheet for use in connection only, i.e., there is sandwiched an insulating connection layer having no conductor circuit and having via-holes (filled vias) filled with a conductor. In the resulting multi-layer wiring board, therefore, the conductor circuits of the circuit boards are electrically connected together due to the filled vias of the insulating connection sheet.

Second, in the multi-layer wiring board of the present invention, the conductor circuits are connected together, without relying upon a simple contact joining between the connection surfaces of the conductor circuits and the connection surfaces of the conductors of the filled vias, by using a metal bonding portion (diffusion junction portion) formed upon diffusion of the junction conductor on the side of the filled vias into the conductor of the conductor circuits. Here, the junction conductor may be the same as, or may be different from, the conductor filled in the via-holes. That is, in the former case, the filled conductor itself may be a junction conductor and in the latter case, the via-holes are filled with the conductor up to a predetermined depth and a junction conductor is further disposed at both ends of the filled conductor.

Third, in the multi-layer wiring board of the present invention, the circuit boards and the connection sheets are formed from an insulating resin material (in other words, an insulating resin material is used as a base material or as a base member), and the regions other than the conductor circuits of the circuit boards and the regions other than the filled vias of the connection sheets are directly joined together without using an adhesive layer, contrary to that of the prior art batch lamination method. Therefore, the base material resin used herein can exhibit remarkable adhesiveness together with the base material resin which is adjacent thereto at the time of heating and press-adhesion.

Fourth, the circuit boards and the connection sheets each has a form of an independent precursor sheet having fabricated thereon conductor circuits, filled vias and the like. Namely, these board elements can be immediately used for the production of the multi-layer wiring board without including any further fabrication steps. The multi-layer wiring board can be produced by advantageously utilizing the batch lamination method of laminating a plurality of circuit boards and a plurality of connection sheets in a predetermined order, and heating and press-adhering the laminated product at one time.

In the multi-layer wiring board of the present invention having the above-mentioned features which are different from those of the prior art, the insulating layer with a conductor circuit (the first board element), i.e., the circuit board, usually comprises an insulating base material, a conductor circuit formed on at least one surface thereof, and via-holes (also referred to as filled vias or stud vias) filled with a conductor therein as in the conventional circuit board.

The insulating base material is preferably made of a resin material which exhibits adhesive force at the time of heating and press-adhesion. A suitable base material resin includes both a thermoplastic resin and a thermosetting resin, and is selectively used depending upon the structure of the multi-layer wiring board and the conditions of production. Though not limited to those described below, the thermoplastic resin may preferably be a polyamide resin, a fluorine-contained resin, a polybutadiene resin or a polyphenylene ether resin. Since it can be heated again, the thermoplastic resin can be molded again even in case the production has failed during its process. Further, though not limited to these described below, the thermosetting resin may preferably be a polyimide resin, an epoxy resin or a phenol resin. The thermosetting resin is characterized by its large adhering force. The base material resin may, as required, be used in combination with a reinforcing material such as a nonwoven fabric or may be blended with an additive such as a filler provided it does not adversely affect the action and effect of the invention.

In the present invention, the base material resin used can exhibit an adhering effect by itself, thereby obviating the need of using an adhesive. As compared to the prior art methods, therefore, the circuit boards and connection sheets used in the present invention can be joined together very simply and reliably. Further, the connection is accomplished highly reliably since no adhesive layer is present at portions where the two conductors are connected together. Improvements are accomplished in both of the production cost and lead time.

The insulating base material may be used at different thicknesses depending upon the constitution (thickness, number of the laminated layers, etc.) of the multi-layer wiring board. Usually, the insulating base material has a thickness of from about 0.03 to 3 mm.

In the insulating base material, a conductor circuit is formed on one surface or on both surfaces thereof. The conductor circuit includes wiring, electrodes, lands, terminals and shielding patterns as is conventional in the circuit boards. In producing the circuit board, further, the conductor circuit can be formed by relying upon a general technique. For example, a laminated plate lined with a copper foil on one surface or on both surfaces thereof is prepared, and the copper foil is selectively patterned to advantageously form the conductor circuit. Alternatively, a conductor metal is selectively plated on the surface of the substrate, or the conductor metal is plated on the whole surface thereof and the undesired portions are selectively removed to form the conductor circuit. As required, the conductor circuit may be formed relying upon a thin film-forming method such as vaporization method, other than the plating method. Though not limited to those described below, the conductor metal suited for forming the conductor circuit may be a low-resistance metal such as copper, aluminum, gold, platinum or silver, or an alloy thereof. The conductor circuit is usually formed of a single layer of foil or plating of the above low-resistance conductor metal. As required, however, the conductor circuit may have a composite structure consisting of two or more layers.

The thickness of the conductor circuit can be widely varied depending upon the conditions of formation thereof and the constitution of the circuit board, but is, usually, from about 1 to about 200 μm when it is formed of a copper foil.

The circuit board of the present invention has conductor-filled via-holes (filled vias) in combination with the conductor circuit to electrically connect the conductor circuit to another conductor circuit or the like. The filled vias are usually formed according to any conventional methods. For example, the filled vias are formed by forming via-holes in the base material at predetermined places by laser drilling and by filling the via-holes with a suitable conductor. The via holes have a diameter (via diameter) that can be varied over a wide range but is, usually, from about 10 to 200 μm and is, preferably, from about 40 to about 120 μm.

The filled vias can be formed by using a variety of conducting metals that have generally been used in the formation of the circuit boards. Though not limited to those described below, suitable conductor metals include copper, gold, silver, nickel, aluminum, tin, lead, tungsten, metals of the group of platinum, indium, bismuth, and alloys thereof. Depending upon the cases, further, there may be used, as a conducting metal, a brazing material or a soldering material used for forming metal bonding portions in the sheet for use in only connection that will be described below. These conducting metals can be filled in the through-holes by plating, by supplying balls or by printing (e.g., screen printing). However, any other filling method may be employed as required. Upon filling the through-holes with the conductor, the obtained multi-layer wiring board is effectively prevented from losing quality and characteristics. This is because, when the through-holes are not filled, a space is formed in the junction surface and there occur such inconveniences as a decrease in the strength against thermal stress and an increase in the resistance due to a decrease in the junction areas.

In the circuit board of the present invention, the conductor metal used for forming the filled vias can further be advantageously used in the formation of the conductor circuit, in addition to forming the conducting portions. That is, the through-holes are filled with the conductor metal in a manner that it spreads over the surface of the base material while maintaining a predetermined thickness from the ends of the filled metal. Thereafter, the thin conductor metal film formed on the surface of the base material is selectively removed to form the conductor circuit in a desired pattern. In this case, the thickness of the thin conductor metal film formed on the surface of the base material can be widely changed depending upon the designing matters of the circuit board but is, usually, from about 1 to 50 μm.

The circuit board may basically have a constitution as described above. As required, however, the conventional circuit board may be utilized to apply any changes or parts to the circuit board of the present invention within a range in which they do not adversely affect the action and effect of the invention.

The insulating connection layer having no conductor circuit, i.e., the connection sheet, which is the second board element, usually, comprises an insulating base material and via-holes (filled vias) filled with a conductor.

Preferably, the insulating base material is made of a resin material that exhibits an adhering force at the time when it is heated and press-adhered as in the above-mentioned circuit board. Therefore, the insulating base material includes both a thermoplastic resin and a thermosetting resin which can be selectively used depending upon the structure of the multi-layer wiring board and the conditions of production. The thermoplastic resin may preferably be a polyamide resin, a fluorine-contained resin, polybutadiene resin or a polyphenylene ether resin. The thermosetting resin may preferably be a polyimide resin, an epoxy resin or a phenol resin. These resins can exhibit a high adhering force as described above.

The insulating base material is used at different thicknesses depending upon the constitution of the multi-layer wiring board (thickness, number of the laminated layers, etc.). The insulating base material generally has a thickness of from about 0.03 to 1 mm.

In the connection sheet, the via-holes (filled vias) formed in the base material thereof and filled with a conductor, is intended to electrically connect together the conductor circuits of the upper and lower circuit boards between which the connection sheet is interposed. The filled vias in the connection sheet can basically be formed according to a conventional manner like the filled vias in the above-mentioned circuit boards. For example, the filled vias are formed by forming via-holes in the base material at predetermined places by laser drilling and filling the via-holes with a suitable conductor. The via diameter can be varied over a wide range but is, usually, from about 10 to 200 $\mu$m and, preferably, from about 40 to 120 $\mu$m.

The filled vias can be formed by using a variety of conducting metals that have generally been used in the formation of circuit boards. Though not limited to those described below, suitable conducting metals include copper, gold, silver, metals of the platinum group, nickel, aluminum, tin, lead, tungsten, indium, bismuth and alloys thereof. Depending upon the case, further, there may be used, as a conducting metal, a brazing material or a soldering material used for forming metal bonding portions. These conducting metals can be filled in the through-holes by plating, by supplying balls or by printing (e.g., screen printing). Of course, any other filling method may be employed as required.

In the above-mentioned connection sheet, both ends of the conductor filled in the filled vias are used to form metal bonding portions, together with the conductors of the adjacent conductor circuit, to thereby ensuring a strong junction between the connection surfaces of the conductor circuit and the connection surfaces of the conductor in the via holes. The metal bonding portions comprise an alloy layer formed as a function of diffusion of the conductor of the filled vias into the conductor of the conductor circuits due to high temperatures caused in the press-adhesion step by heating. Therefore, the metal bonding portions can be referred to as diffusion junction portions. A low resistance and a high reliability are easily realized as a result of introducing the metal bonding portions into the multi-layer wiring board. Here, the conductor taking part in the formation of the metal bonding portions is particularly referred to as the junction conductor.

The junction conductor that can take part in the formation of the metal bonding portions may be the same as, or different from, the conductor filled in the filled vias. Namely, the conductor filled in the filled vias may, as a whole, be the junction conductor or may partly be the junction conductor. In the latter case, both ends of the filled vias can be formed of the junction conductor, i.e., the portions of the filled vias close to the surfaces of the connection sheet can be formed of the junction conductor.

In the practice of the present invention, a variety of conductors can be used as junction conductors. A suitable junction conductor is the one that forms a favorable alloy layer, by being diffused into the conductor of the circuit board, even at a relatively low temperature and, preferably, is a low-melting brazing material or soldering material. Though not limited to those described below, suitable junction conductors include such conductor metals as Sn, Bi, In, Zn, Pb, Sb, Au, Ag and alloys thereof. Examples of the junction conductor that can be particularly advantageously used include Sn, Sn—Cu, Sn—Pb, Ag—Sn and the like.

The above-mentioned brazing material or soldering material which is used as junction conductor can, usually, be filled in the through-holes by plating, by supplying balls or by printing (e.g., screen printing). However, any other filling method may be employed as required. For example, there can be employed a method of filling the through-holes with a required amount of solder balls or a method of filling a solder paste. When the solder paste is to be filled, however, it will be necessary to execute a reflow step prior to laminating the layers. When the solder paste is to be partly applied to the end surfaces of the filled vias, the coating technology can be advantageously employed. Either method contributes to decreasing the cost, shortening the read time, and improving the yield.

The connection sheet may basically be constituted as described above. As required, however, the connection sheet may be arbitrarily modified or any parts may be added thereto. However, the modification or addition should not adversely affect the action and effect of the present invention.

Preferably, the multi-layer wiring board of the present invention is obtained by independently preparing the circuit boards and the connection sheets in the form of precursor sheets in which the conductor circuits have been formed in advance, laminating a plurality of sheets of these precursor sheets according to predetermined order, and batchwise heating and press-adhering them together.

Since the circuit boards and the connection sheets are in a state of finished products, they can be very favorably handled and preserved. Therefore, they can be preserved by being contained in a suitable container and can be transported to the site without causing the problem of breakage on the way. Besides, they are favorably handled and do not need the use of adhesive, making it possible to conduct the step of lamination smoothly and easily.

The step of batchwise heating and press-adhering the laminate batchwise can be conducted according to any conventional methods. In the heating/press-adhering apparatus, for example, a chamber which air-tightly maintains the interior thereof contains two pieces of upper and lower pressuring plates for compression with the laminate held therebetween, and a heater for heating the pressuring plates to a predetermined temperature. The chamber is filled with an inert atmosphere such as a nitrogen gas. A temperature sensor is also disposed to adjust the heating temperature. By using the above-mentioned apparatus for production, the heating temperature is, usually, from about 200 to 350° C. and the pressure is usually 30 kg·f/cm$^2$. The temperature, the pressure and the time for heating/press-adhesion can be suitably changed as required, as a matter of course.

The present invention further resides in a method of producing the multi-layer wiring board comprising a plurality of laminated insulating layers each having a conductor circuit.

As will be understood from the foregoing description, the method of producing the multi-layer wiring board of the present invention comprises the steps of: electrically connecting the conductor circuits of the insulating layers together through conductor-filled via-holes of an insulating connection layer having no conductor circuit disposed between the insulating layers; joining connection surfaces of the conductor circuits and connection surfaces of the conductor of the via-holes together by a metal bonding portion formed by diffusing, in the conductor of the conductor circuits of the insulating layers, a junction conductor which may be the same as, or is different from, the conductor filled in the via-holes of the connection layers, and directly joining the regions other than the conductor circuits of the insulating layers and the regions other than the via-holes of the connection layers together by press-adhering the insulating resins that constitute the respective layers.

In addition to the multi-layer wiring board and the method of production thereof, the present invention further provides a method of laminating two circuit boards consisting of the upper one and the lower one to make a unitary structure by using on connection sheet to thereby electrically connect them, and the multi-layer wiring board obtained by this method, as well as a connection sheet for the production of multi-layer wiring boards, which is prepared independently of the circuit boards, can be handled alone, can be preserved and carried, as required, by being contained in a frame or a container and a method of producing the same.

According to the present invention, as an intermediate sheet (insulating connection layer) exclusively used for connection is interposed between the circuit boards and is constituted to have a connection site on its both surfaces, it becomes possible to decrease the material cost. Besides, as the intermediate sheet can be independently prepared, the yield and lead time are not adversely affected.

After the connection sheet and the circuit boards are prepared as finished articles, a batch lamination step is continued. Therefore, defective articles are sorted out in the finished articles having low additional value due to not yet being laminated, and thus the cost can be lowered. Further, since the step of batch lamination uses the connection sheet and the circuit boards after the defective articles have been sorted out, the yield is very high. Moreover, as the number of the layers increases, an increase in merit such as number of steps, yield, cost, etc. can be obtained based on the successive lamination.

The metal bonding portions can be formed by using either a low-melting point metal with which the through-holes are filled or a low-melting point metal with which is coated on a low-resistance material filled in the through-holes. Means for supplying the low-melting point metal can be optionally selected from many methods such as plating, filling with balls, printing and the like. This also contributes to decreasing the cost, shortening the lead time and increasing the yield. In addition, since the connection is accomplished with a metal itself, the multi-layer wiring board is more advantageous in regard to connection reliability and conductivity than when an electrically conducting paste is used as an interlayer connection material.

The metal bonding portions can be independently formed by optionally employing any method and can, hence, be controlled for their volume more severely. So far, a dispersion in the volume of the low-melting point metal or an alloy thereof is causing a decrease in the reliability as it stems from a dispersion in the strength and amount of diffusion as well as other problems. Therefore, severely controlling the volume of the metal bonding portions is worth attention.

Like controlling the volume, the texture of the metal bonding portions can be made homogeneous to a high degree. Therefore, the junction conductor can be diffused more homogeneously and, as a result, a high reliability is maintained.

The connection sheet can be handled alone. With the thickness being small, weight being small and having no circuit on the surfaces, the connection sheet can be very easily handled, compared to handling the board itself, by using a jig such as a frame for handling.

The insulating base material (resin) for the connection sheet is naturally adhesive and thus it does not require any adhesive, making it possible to join the circuit boards very simply and reliably as compared to that of the prior art method of using an adhesive. Further, since no adhesive exists over the metal bonding portions, the junction can be obtained at a high reliability. In addition, an improvement is accomplished in regard to both cost and lead time. In particular, a great advantage resides in that there are simultaneously obtained the junction due to the metal bonding portions after heated and press-adhered and the junction due to the adhesion between the base material resins.

As the connection sheet is prepared and supplied independently from the circuit boards, it becomes possible to severely control the thickness of the insulating connection layer in the multi-layer wiring board and the thicknesses of the filled vias and of the metal bonding portions.

Use of the insulating connection layer makes it possible to decrease the number of the circuit boards (copper-lined boards) used. Use of the connection layer adds to the cost, however, as an increase of the cost is very much smaller than the cost of the circuit boards, this enables the cost to be decreased as a whole.

In the structure for connecting the layers in the multi-layer wiring board of the present invention, basically, no through-hole is required. Omission of the through-holes helps increase the density and improve high-frequency characteristics. Further, as the step of plating the through-holes can be omitted, the cost can be decreased. Furthermore, as the plating can be omitted, the thickness of the copper foil forming the circuits on the surface of the wiring board can be decreased, which is advantageous for increasing the density of the circuit patters and for reducing the weight.

EXAMPLE

Examples of the invention will now be described with reference to the accompanying drawings. It should be noted that the invention is in no way limited to the following examples only.

Figure 2:
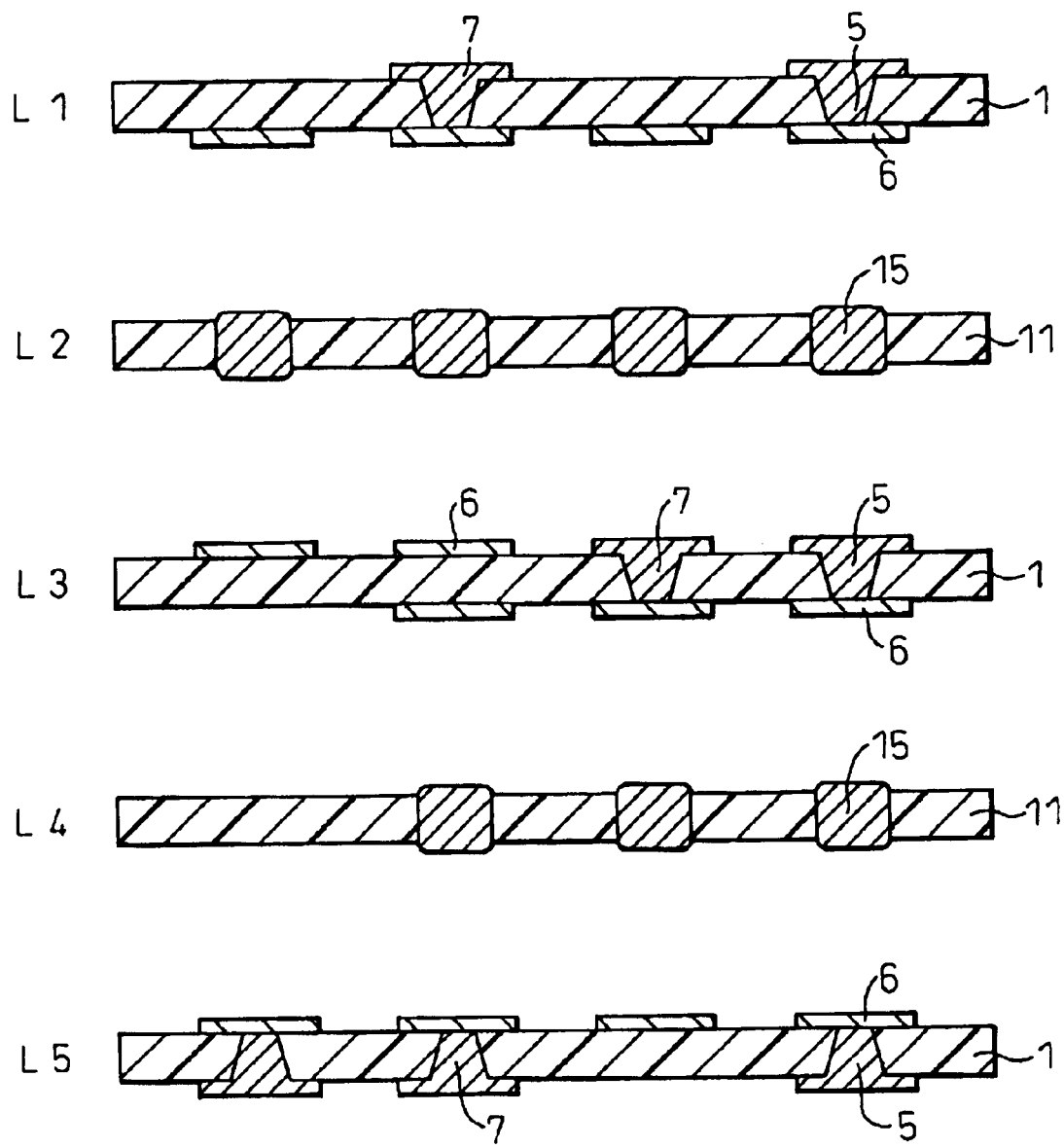
FIG. 2 is a sectional view illustrating the multi-layer wiring board shown in FIG. 1 in a disassembled manner.

FIG. 1 is a sectional view illustrating a preferred example of the multi-layer wiring board according to the present invention, and FIG. 2 is a sectional view illustrating the multi-layer wiring board shown in FIG. 1 in a disassembled manner.

A multi-layer wiring board 30 shown has a five-layer structure comprising a circuit board L1, a sheet L2 for connection, a circuit board L3, a sheet L4 for connection and a circuit board L5 from the upper side in this order. The multi-layer wiring board 30 is produced by laminating the sheets for connection so as to be sandwiched among the circuit boards, and batchwise heating and press adhering them, i.e. at one time.

The circuit boards L1, L3 and L5 are in a state of finished articles having passed the performance testing. These circuit boards are constituted in the same manner as the conventionally used circuit boards. That is, each circuit board comprises an insulating layer 1 made of a resin board (imide resin, here), a low-resistance conductor (copper plating, here) 5 filled in the via holes formed therein penetrating therethrough, and conductor circuits (copper wirings, here) 6 and 7 of a low-resistance metal formed in predetermined patterns on both the front and back surfaces of the base material. The drawing illustrates only one example, and the arrangements of the filled vias 5 and of the conductor circuits 6 and 7 can be arbitrarily modified depending upon the structure of the multi-layer wiring board.

The sheets L2 and L4 for connection are also in a state of finished articles having passed the performance testing like the circuit boards. Each sheet for connection includes an insulating connection layer 11 of a resin base material (polyimide resin, here) and a junction conductor 15 filled in the via-holes formed therein penetrating therethrough. The sheet for connection is an intermediate sheet used exclusively for connection purposes, and has none of the conductor circuits or related parts of the circuit board. The junction conductor 15 is suitably selected from metals or metal alloys capable of forming a favorable alloy layer upon diffusing into the conductor (metal) of the circuit board even at a relatively low temperature. In the illustrated embodiment, the junction conductor 15 is an Sn-plated layer. The drawing illustrates only one example, and the arrangement of the junction conductor 15 can be arbitrarily changed depending upon the filled vias 5 in the circuit boards and arrangements of the conductor circuits 6 and 7.

Figure 3:
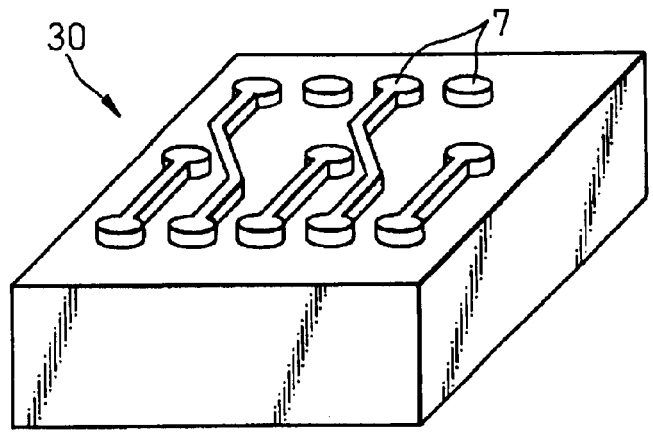
FIG. 3 is a perspective view schematically illustrating the appearance of the multi-layer wiring board shown in FIG. 1.
Figure 4:
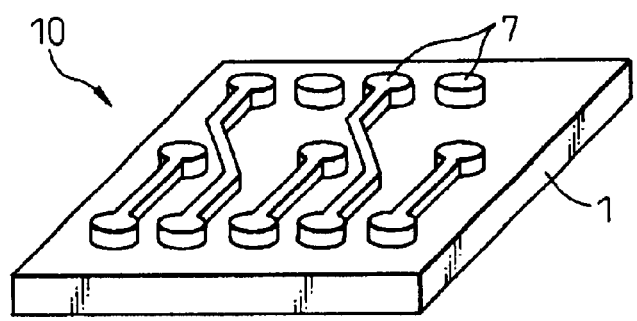
FIG. 4 is a perspective view schematically illustrating the appearance of the circuit board in the multi-layer wiring board shown in FIG. 1.
Figure 5:
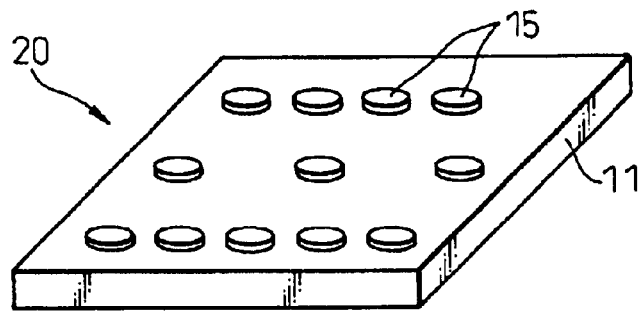
FIG. 5 is a perspective view schematically illustrating a sheet for connection only in the multi-layer wiring board shown in FIG. 1.

If schematically shown in a perspective view, the above multi-layer wiring board 30 is as illustrated in FIG. 3. It will be understood that the conductor circuits 7 are formed in a predetermined pattern on the surface of the wiring board 30. FIG. 4 is a perspective view schematically showing the appearance of the circuit board 10 of the multi-layer wiring board 30 shown in FIG. 1. The insulating layer 1 has conductor circuits 7 formed in a predetermined pattern on the surface thereof. FIG. 5 is a perspective view schematically illustrating the sheet 20 for connection in the multi-layer wiring board 30 shown in FIG. 1. The insulating connection layer 11 has junction conductors 15 buried therein penetrating therethrough and having protruding ends.

Referring to FIG. 1, again, the conductor circuits 6 and 7 of the circuit boards L1, L3 and L5 in the multi-layer wiring board 30 are electrically connected together through the filled vias (conductor-filled via-holes) 15 in the sheets for connection interposed among the circuit boards, the sheets for connection having no conductor circuit.

Figure 8:
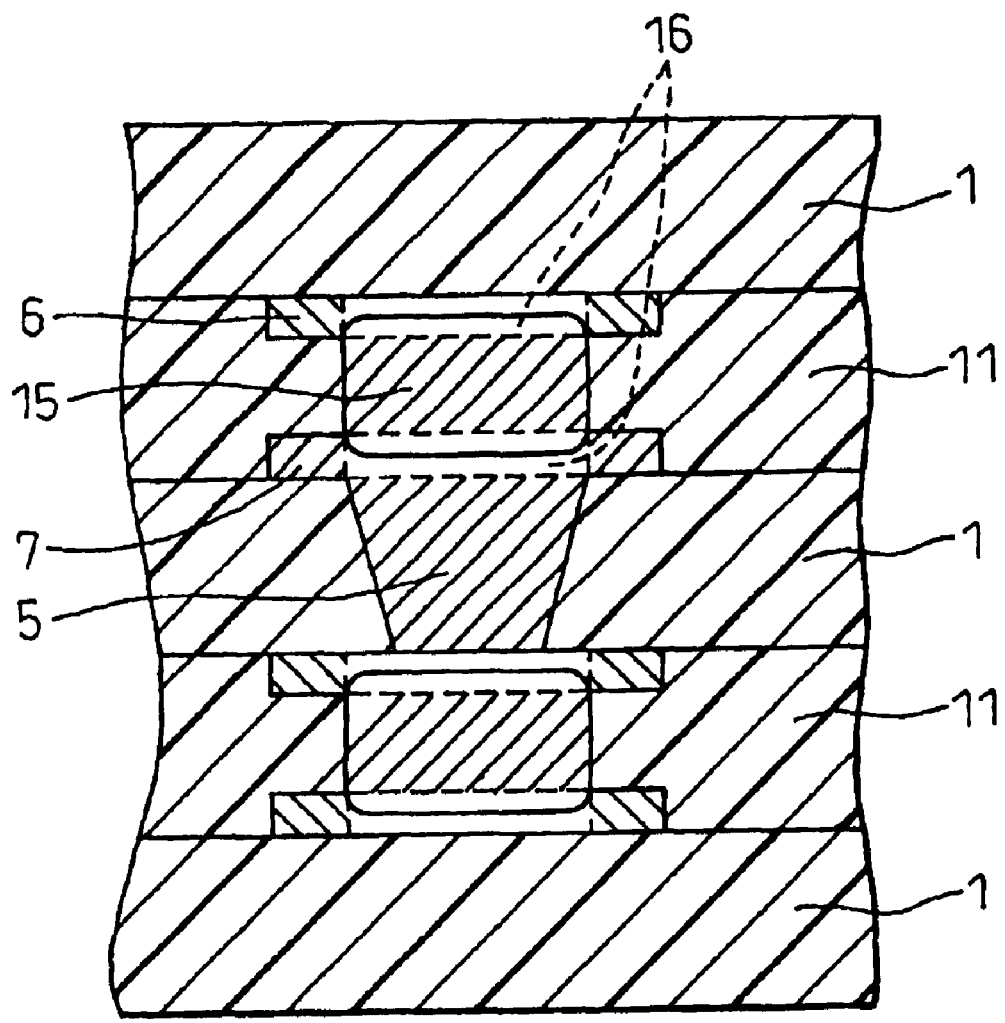
FIG. 8 is a sectional view schematically illustrating the state of a metal bonding portion formed by the conductor of the conductor circuit and the junction conductor in the multi-layer wiring board shown in FIG. 1.

Here, as illustrated on an enlarged scale in FIG. 8, what is important is that the electric connection in the multi-layer wiring board 30 is such that the connection surfaces of the conductor circuits 6 and 7 in the circuit board and the connection surfaces of the filled vias 15 in the sheets for connection are firmly joined together by metal bonding portions (diffusion junction portions) 16 of an alloy formed as the junction conductor of the filled vias 15 is diffused into the conductor of the conductor circuits 6 and 7. The metal bonding portions 16 not only guarantee a favorable electric connection but also offer a very high bonding strength as they are formed of a bond (alloy) between metals, and are excellent in forming the multi-wiring board 30 as an integral structure. As the conductor circuits are electrically favorably connected together, there is no need to form through-holes making it possible to provide high density and high-frequency characteristics. As required, through-holes may be formed, as a matter of course, within a range in which they do not adversely affect the action and effect of the present invention.

Further, in the case of the illustrated multi-layer wiring board 30, the circuit board and the sheet for connection which are neighboring to each other are such that the regions other than the conductor circuits 6 and 7 of the circuit boards and the regions other than the filled vias 15 of the sheet for connection are directly joined together by press-adhering the insulating resins that constitute the circuit board and the base material of the sheet for connection. This is because a suitable degree of adhesive force is produced during the press-contacting by heating due to the properties of the insulating resin itself used as a base material. Owing to such an adhesive force, the circuit board and the sheet for connection are connected together without the need of interposing the adhesive layer. In addition, since the mechanical bond due to the metal bonding portions and the adhesive force between the base material resins act synergistically, the multi-layer wiring board 30 is laminated in a very good condition.

In the multi-layer wiring board 30, the circuit board 10 and the sheet 20 for connection can be produced according to various technologies.

For example, the circuit board L1 in the multi-layer wiring board 30 shown in FIG. 1 can be advantageously produced according to steps of production successively illustrated in FIGS. 6A to 6D.

Figure 6A:
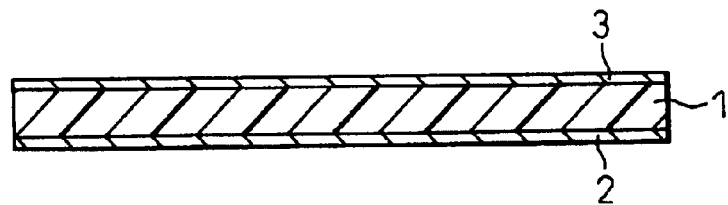
FIGS. 6A–6D are sectional views illustrating in sequence, the steps of producing a circuit board in the multi-layer wiring board shown in FIG. 1.

Referring to FIG. 6A, first, a laminated plate lined with a copper foil on both surfaces thereof is prepared as an insulating layer 1. The insulating layer 1 comprises a resin base material 1 and copper foils 2 and 3 lined on the front and back surfaces thereof. The resin base material 1 has a thickness of about 1 mm. Though a polyimide resin is used as the resin base material 1, it may be either a thermoplastic resin or a thermosetting resin. Further, the copper foils 2 and 3 have a thickness of about 20 $\mu$m.

Figure 6B:
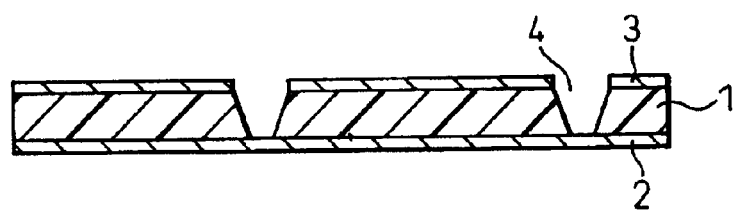

Referring next to FIG. 6B, via-holes 4 are perforated in the resin base material 1 from the side of the copper foil 3. The via diameter is about 50 $\mu$m. The laser drilling can be advantageously used as perforation means.

Figure 6C:
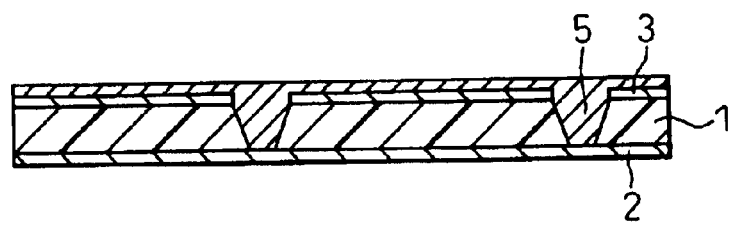

After the via-holes are formed, copper 5 is plated at the step of FIG. 6C so as to fill the via-holes and to cover the surface of the copper foil 3. The copper plating 5 can be advantageously formed by the nonelectrolytic plating. The copper plating 5 formed on the copper foil 3 has a thickness of about 10 $\mu$m.

Figure 6D:
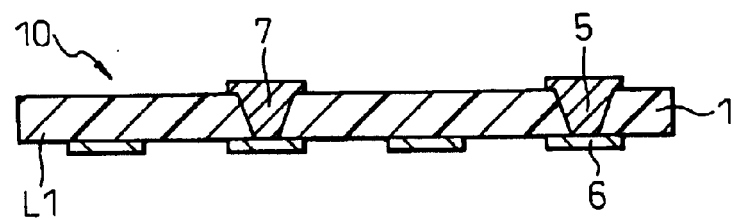

Referring next to FIG. 6D, the conductor circuits (copper wirings) 6 and 7 are patterned. The patterning is executed relying upon the subtractive method by dissolving and removing unnecessary portions of the copper foil 2 and of the copper plating 5 by etching. As desired, however, there may be employed an additive method or any other method. A desired circuit board 10 is obtained.

Further, the sheet L2 for connection in the multi-layer wiring board 30 shown in FIG. 1 can be advantageously produced through steps of production successively illustrated in FIGS. 7A to 7D, for example.

Figure 7A:
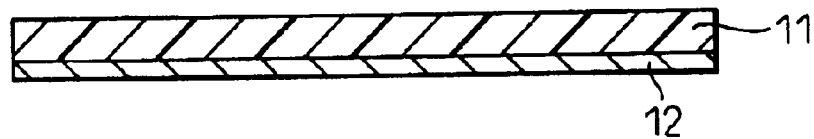
FIGS. 7A–7D are sectional views illustrating, in sequence, the steps of producing a sheet for connection in the multi-layer wiring board shown in FIG. 1.

Referring to FIG. 7A, first, a laminated plate lined with a copper foil on one surface thereof is prepared as an insulating connection layer 1. The connection layer 11 comprises a resin base material 11 and a copper foil 12 lined on one surface thereof. The resin base material 11 has a thickness of about 0.5 mm. Though a polyimide resin is used as the resin base material 11, it may be either a thermoplastic resin or a thermosetting resin like the above-mentioned circuit board. The copper foil 12 has a thickness of about 20 $\mu$m.

Figure 7B:
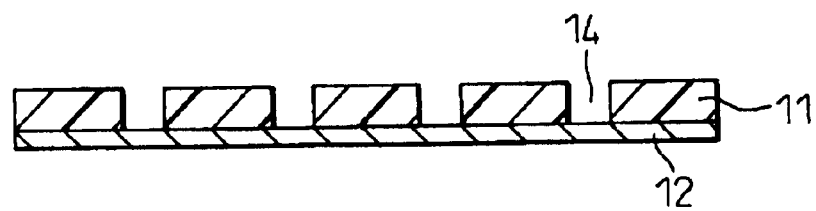

Referring next to FIG. 7B, via-holes 14 are perforated in the resin base material 11 from the side where there is no copper foil 12. The via diameter is about 50 $\mu$m. The drilling utilizing a laser of carbonic acid gas can be advantageously used as perforation means.

Figure 7C:
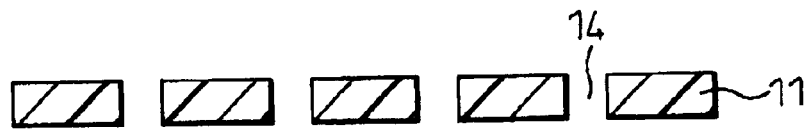

After the via-holes are formed, copper foil 12 is peeled off from the resin base material 11 at the step of FIG. 7C. The step of peeling may be carried out after a subsequent step of filling the junction conductor has been completed. Alternatively, while an electric current is applied to a portion of the copper foil 12, the junction conductor may be filled by the electrolytic plating, followed by peeling off the copper foil 12.

Figure 7D:
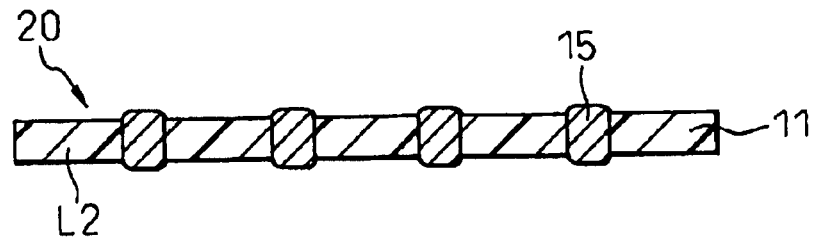

Referring finally to FIG. 7D, the via-holes in the resin base material 11 are filled with the junction conductor 15. As the junction conductor 15, there can be used a low-melting point brazing material or solder material. Here, Sn is used as the junction conductor 15, and the via-holes are filled by the plating thereof. At this time, ends of the junction conductor are slightly protruded beyond the surface of the base material 11. A desired sheet 20 for connection is obtained.

According to the present invention as described above in detail, it becomes possible to produce a multi-layer wiring board at one time maintaining a high yield at a low cost despite the circuit boards are laminated in many number.

Further, according to the present invention, the adhesive layer is not used as connection means but, instead, the mechanical and electric connections are accomplished by forming an alloy of the conductor of the circuit boards and of the junction conductor. Therefore, the circuits of the upper and lower circuit boards are electrically favorably connected making it possible to produce a multi-layer wiring board that offers high reliability.

Furthermore, according to the present invention, the circuit boards and the connection layers for connection only interposed among them are firmly joined together, and a larger connection strength is provided and compounded by the effect of the mechanical connection of the conductor portions.

What is claimed is:

1. A multi-layer wiring board, comprising:
   a plurality of circuit layers comprising one or more conductor circuits and one or more first conductor filled via holes, wherein said first conductor of said first conductor filled via holes, does not comprise a dispersed metal powder;
   one or more connection layers free from conductor circuits, provided between said circuit layers and in direct communication with said circuit layers, said one or more connection layers comprising one or more second conductor filled via-holes, said second conductor comprising a core conductor and a junction conductor, wherein said circuit layers and said connection layers are laminated together, and
   one or more metal bonding portions formed by lamination of said circuit layers and said connection layers, comprising one or more alloy layers, for electrically connecting said conductor circuits of said circuit layers, said one or more alloy layers formed at an interface between said second conductor filled via-holes and said conductor circuits of said circuit layers, said alloy layers comprising said junction conductor diffused into the conductor of said conductor circuit, wherein said diffusion occurs upon lamination of said layers.

2. The multi-layer wiring board of any one of claim 1, said one or more connection layers further comprises a resin composition.

3. The multi-layer wiring board of claim 2, said resin composition comprising a thermoplastic resin, a thermoplastic resin, or a thermosetting resin.

4. The multi-layer wiring board of claim 3, said resin composition consists of a thermosplastic resin.

5. A multi-layer wiring board according to claim 3, wherein said thermoplastic resin is a polyamide resin, a fluorine-contained resin, a polybutadiene resin or a polyphenylene ether resin.

6. A multi-layer wiring board according to claim 3, wherein said thermosetting resin is a polyimide resin, an epoxy resin or a phenol resin.

7. The multi-layer wiring board of any one of claim 1, wherein said multi-layer wiring board does not comprise a through-hole.

8. The multi-layer wiring board of any one of claim 1, wherein said multi-layer wiring board does not comprise an adhesive layer.

9. A multi-layer wiring board of any one of claim 1, wherein said circuit layers are in the form of circuit precursor sheets, and said connection layers are in the form of connection precursor sheets, and said connection layers having said conductor circuits already fabricated therein, and said multi-layer wiring board is formed by laminating a plurality of said precursor sheets in a predetermined order and by heating and press-adhering them together at one time.

10. The multi-layer wiring board of any one of claim 1, wherein said conductor circuits comprise at least one foil or plating layer of a low-resistance conductor metal selected from the group consisting of copper, aluminum, gold, platinum, silver and alloys thereof.

11. The multi-layer wiring board of any one of claim 1, wherein said junction conductor comprises a low-melting point brazing material or solder material.

12. The multi-layer wiring board of claim 11, wherein said brazing material or solder material is a conductor metal selected from the group consisting of Sn, Bi, In, Zn, Pb, Sb, Au, Ag and alloys thereof.

13. The multi-layer wiring board of claim 12, wherein said brazing material or solder material comprises Sn, Sn—Cu, Sn—Pb or Ag—Sn.

14. A multi-layer wiring board, comprising:
   a plurality of circuit layers comprising one or more conductor circuits and one or more first conductor filled via holes, wherein said first conductor of said first conductor filled via holes, does not comprise a dispersed metal powder;
   one or more connection layers free from conductor circuits, provided between said circuit layers and in direct communication with said circuit layers, said one or more connection layers comprising one or more second conductor filled via-holes, wherein said circuit layers and said connection layers are laminated together, and
   one or more metal bonding portions formed by lamination of said circuit layers and said connection layers, comprising one or more alloy layers, for electrically connecting said conductor circuits of said circuit layers, said one or more alloy layers formed at an interface between said second conductor filled via-holes and said conductor circuits of said circuit layers, said alloy layers comprising said second conductor diffused into the conductor of said conductor circuit, wherein said diffusion occurs upon lamination of said layers.

15. The multi-layer wiring board of claim 14, said second conductor comprises a core conducting material having a junction conductor material provided thereon such that said junction conducting material is diffused into said conductor of said conductor circuit upon lamination of said layers.

* * * * *